United States Patent
Sasaki et al.

(10) Patent No.: US 7,821,115 B2
(45) Date of Patent: Oct. 26, 2010

(54) TAPE CARRIER PACKAGE INCLUDING A HEAT DISSIPATION ELEMENT

(75) Inventors: Chihiro Sasaki, Kawasaki (JP); Yasuaki Iwata, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 994 days.

(21) Appl. No.: 11/566,892

(22) Filed: Dec. 5, 2006

(65) Prior Publication Data

US 2007/0126090 A1 Jun. 7, 2007

(30) Foreign Application Priority Data

Dec. 5, 2005 (JP) ............................. 2005-350835

(51) Int. Cl.
*H01L 23/495* (2006.01)
*H01L 21/00* (2006.01)
*H01R 9/00* (2006.01)

(52) U.S. Cl. ................... 257/668; 257/694; 257/707; 257/735; 257/E23.01; 257/E23.014; 257/E23.031; 257/E23.034; 257/E23.043; 257/E23.141; 361/773; 361/813; 438/123

(58) Field of Classification Search .................. None
See application file for complete search history.

(56) References Cited

U.S. PATENT DOCUMENTS 6,713,850 B1 * 3/2004 Yuan et al. ................... 257/668

FOREIGN PATENT DOCUMENTS

| JP | 2-155248 A | 6/1990 |
|---|---|---|
| JP | 3-57248 A | 3/1991 |
| JP | 10-32229 A | 2/1998 |
| JP | 2004-111996 A | 4/2004 |

* cited by examiner

*Primary Examiner*—Alonzo Chambliss
(74) *Attorney, Agent, or Firm*—Sughrue Mion, PLLC

(57) ABSTRACT

A semiconductor device on a tape carrier package with improved heat dissipation, as provided. The number of outputs of the semiconductor device has been increased for implementing a multi-channel configuration, and narrower pitches are employed. Included are a tape carrier 20 having lead patterns 21 to 24 formed on a tape base 28 thereof, and a semiconductor device 10 mounted on the tape carrier 20 and having electrode patterns 11 to 14 disposed thereon. The semiconductor device 10 includes heat dissipating electrode patterns 15 to 17 at positions where the heat dissipating electrode patterns 15 to 17 do not interfere with the electrode patterns 11 to 14. The lead patterns 21 to 24 are electrically connected to the corresponding electrode patterns 11 to 14, respectively. On the tape carrier 20, heat dissipation patterns 25 to 27 are formed. The heat dissipation patterns have a surface area broader than that of the lead patterns and have the heat dissipating electrode patterns disposed thereon.

16 Claims, 4 Drawing Sheets

[X-X´]

[Y-Y']

TAPE CARRIER PACKAGE INCLUDING A HEAT DISSIPATION ELEMENT

FIELD OF THE INVENTION

The present invention relates to a tape carrier package with a semiconductor device mounted on a tape carrier thereof and a display device including the tape carrier package. More specifically, the invention relates to the tape carrier package that improves heat dissipation of the semiconductor device and the display device with the tape carrier package mounted thereon.

BACKGROUND OF THE INVENTION

On display devices such as a liquid crystal display (LCD), a tape carrier package (TCP) is mounted. The tape carrier package includes on a tape carrier thereof an IC chip (semiconductor device) that will become a display driver. In such a TCP, with a larger size and a higher definition of a panel, the number of outputs of the IC chip has been increased for implementing a configuration of multi-channels (800 to 1000 ch). Then, pitches of lead patterns on the tape carrier have been become narrower and narrower. In the IC chip where the number of outputs has increased for implementing the multi-channel configuration, the amount of heat generation increases due to an increase in an operation load. For this reason, in the TCP, heat dissipation as the package becomes important so as to stabilize an operation of the IC chip.

Heat generated in the IC chip is discharged outside the TCP mainly through lead patterns of the TCP. This is because a conductor (made of a copper foil or the like) has a higher heat conductivity than a tape substrate (made of polyimide, or the like). Accordingly, in order to increase the heat dissipation of the TCP, an increase in volume and surface area of the lead patterns becomes effective means.

Among conventional TCPs, there is a TCP in which for increasing the surface area of the lead patterns (conductor patterns), second conductor patterns 108 that do not substantially play a role in signal input and output for a semiconductor 102 (IC chip) are formed on a blank area on which no first conductor pattern 107 for signal input and output for the, semiconductor device 102 is arranged. Element 106 represents an input lead, and element 115 represents an insulation layer (refer to FIGS. 7 and 8; and refer to Patent Documents 1 and 2).

[Patent Document 1]
 JP Patent Kokai Publication No. JP-P-2004-111996A

[Patent Document 2]
 JP Patent Kokai Publication No. JP-A-10-32229

[Patent Document 3]
 JP Patent Kokai Publication No. JP-A-3-57248

[Patent Document 4]
 JP Patent Kokai Publication No. JP-A-2-155248

SUMMARY OF THE DISCLOSURE

However, when the second conductor pattern 108 that does not substantially play the role in the signal input and output for the semiconductor device 102 is simply formed on the blank area as in the conventional TCP, heat conduction from the semiconductor device 102 to the second conductor pattern 108 becomes insufficient. Accordingly, effective heat dissipation may not be performed. That is, configurations in which electrodes of the semiconductor device 102 and the second conductor pattern 108 are not connected as in inventions described in Patent Documents 1 and 2 are those where the effective heat dissipation may not be performed. Patent Documents 1 and 2 also include configurations in which the second conductor pattern 108 is brought into contact with an end surface of the semiconductor device 102. In these configurations, the second conductor pattern 108 is just brought into contact with, or overlaid on the semiconductor device 102. Thus connection between the semiconductor device 102 and the second conductor pattern 108 is not secure. Accordingly, in these configurations, the heat conduction may become insufficient, and the effective heat dissipation may not therefore be able to be performed. Alternatively, in order to ensure thermal connection between the semiconductor device 102 and the second conductor pattern 108, an additional step may become necessary, and manufacturing cost may be thereby increased.

Further, in the semiconductor device used for the display device, electrodes are normally disposed at edge portions in a longitudinal direction of a rectangular shape of the device. However, together with an increase in the number of outputs for implementing the multi-channel configuration, electrodes have become disposed at end portions (short sides) in a transverse direction of the rectangular shape as well. For this reason, according to the disclosure in Patent Documents 1 and 2, a conductor pattern for heat dissipation may not be able to be disposed in the semiconductor device in which the electrodes are disposed at the end portions in the longitudinal and transverse directions of the rectangular shape. Accordingly, the effective heat dissipation may not be able to be performed.

Incidentally, Patent Documents 3 and 4 disclose configurations in which dummy bumps for heat dissipation are provided at a semiconductor element (or a semiconductor device) and dummy leads for heat dissipation are provided on a tape carrier (or a conductor tape of one layer conductor). It is so arranged that a dummy lead is disposed between rows of leads for performing signal input to or signal output from the semiconductor element. The degree of integration of the IC chip may be thereby reduced. These configurations are not suited to increase in the number of outputs for implementing the multi-channel configuration in the IC chip, or to narrowing pitches.

It is a main object of the present invention is to improve heat dissipation of a semiconductor device on a tape carrier package in which the number of channels for outputs has been increased for implementing a multi-channel configuration and narrower pitches have been adopted.

In a first aspect of the present invention, there is provided a tape carrier package comprising:
 a tape carrier having lead patterns formed on a tape base thereof, the lead patterns being made of an electro-conducting material, the tape base being made of an insulating material; and
 a semiconductor device mounted on the tape carrier and having signal input and output electrode patterns disposed on peripheral portions of a surface of the semiconductor device on the same side as a first surface of the tape base; wherein
 the semiconductor device includes heat dissipating electrode patterns, each of the heat dissipating electrode patterns is located on the peripheral portions of the surface of the semiconductor device at a position where the each of the heat dissipating electrode patterns does not conflict with the electrode patterns;
 each of the lead patterns is electrically connected to a corresponding one of the electrode patterns; and
 heat dissipation patterns are formed on the tape carrier, each of the heat dissipation patterns being disposed at a position on the first surface of the tape base where the each of the heat dissipation patterns does not conflict with the lead patterns, the each of the heat dissipation patterns being electrically and thermally connected to a corresponding one of the heat dissipating electrode patterns of the semiconductor device, the each of the heat dissipation patterns being made of an electro-conductive material.

According to a second aspect, a vacant space for accommodating a part or entire of the semiconductor device is formed on the tape base;

one ends of the lead patterns extend to the vacant space, and each of the lead patterns is electrically and thermally connected to corresponding one of the electrode patterns of the semiconductor device at extending one end; and one ends of the heat dissipation patterns extend to the vacant space, and each of the heat dissipation patterns is electrically and thermally connected to corresponding one of the heat dissipating electrode patterns of the semiconductor device at the extending one end.

According to a third aspect, the lead patterns may comprise an input lead pattern including input external terminals in the vicinity of a first side of the tape base, and output lead patterns including output external terminals in the vicinity of a second side opposite to the first side of the tape base.

According to a fourth aspect, it is preferred that the each of the heat dissipation patterns and the corresponding one of the heat dissipating electrode patterns of the semiconductor device are electrically and thermally connected using pressure bonding between a bump formed on the corresponding one of the heat dissipating electrode pattern and the each of the heat dissipation patterns.

According to a fifth aspect, the bump may comprise a gold bump; and the each of the heat dissipation patterns is made of a tin-plated copper base material or a gold-plated copper base material.

According to a sixth aspect, it is preferred that the semiconductor device has a surface, which the electrode patterns are disposed on and has a rectangular shape; and the heat dissipating electrode patterns are disposed at least in the vicinity of a corner portion or portions of the rectangular shape.

According to a seventh aspect, it is preferred that that the electrode patterns comprise:

input electrode patterns disposed in the vicinity of a first side of the semiconductor device;

first output electrode patterns disposed in the vicinity of a second side opposite to the first side of the semiconductor device; and second output electrode patterns disposed in the vicinity of a third side or sides located in a direction at a right angle to the first side of the semiconductor device;

the output lead patterns comprise:

first output lead patterns electrically connected to corresponding ones of the first output electrode patterns, respectively; and second output lead patterns electrically connected to corresponding ones of the second output electrode patterns, respectively; and the input lead patterns are electrically connected to corresponding ones of the input electrode patterns, respectively.

According to an eighth aspect, it is preferred that the heat dissipation patterns comprise:

first heat dissipation patterns disposed between a group of the first output lead patterns and a group of the second output lead patterns; and second heat dissipation patterns disposed between the group of the input lead pattern and the group of the second output lead patterns; wherein each of the first heat dissipation patterns and the second heat dissipation patterns is electrically and thermally connected to corresponding one of the heat dissipating electrode patterns disposed in the vicinity of a corner portion or portions of the rectangular shape.

According to a ninth aspect, it is preferred that each of the first heat dissipation patterns includes a grounding external terminal or a signal external terminal in the vicinity of the second side of the tape base.

According to a tenth aspect, it is preferred that each of the second heat dissipation patterns includes a grounding external terminal or a signal external terminal in the vicinity of the first side or the second side of the tape base.

According to an eleventh aspect, it is preferred that the electrode patterns include third output electrode pattern disposed on at least one side of the input electrode pattern, in the vicinity of the first side of the semiconductor device; and the output lead patterns include a third output lead patterns electrically connected to corresponding ones of the third output electrode patterns, respectively.

According to a twelfth aspect, it is preferred that the heat dissipating electrode patterns are each disposed between a group of the input electrode patterns and a group of the third output electrode patterns as well;

the heat dissipation patterns comprise:

first heat dissipation patterns disposed between a group of the first output lead patterns and a group of the second output lead patterns;

second heat dissipation patterns disposed between a group of the third output lead patterns and a group of the second output lead patterns; and third heat dissipation patterns disposed between a group of the third output lead patterns and a group of the input lead patterns;

each of the first heat dissipation patterns and the second heat dissipation patterns being electrically and thermally connected to a corresponding one of the heat dissipating electrode patterns disposed in the vicinity of the corner portion or portions of the rectangular shape; and each of the third heat dissipation patterns being electrically and thermally connected to one of the heat dissipating electrode patterns disposed between the group of the input electrode patterns and the group of the third output electrode patterns.

According to a thirteenth aspect, it is preferred that the third heat dissipation patterns include a grounding external terminal or a signal external terminal in the vicinity of the first side or the second side of the tape base.

According to a fourteenth aspect, it is preferred that at least one of the first heat dissipation patterns and the second heat dissipation patterns includes a grounding external terminal or a signal external terminal in the vicinity of the second side of the tape base.

In a fifteenth aspect of the present invention, it is preferred that the tape carrier package is mounted on a display panel of a display device. In other words, there is provided a display device having the tape carrier package as set forth in any one of the preceding aspects (1-14) mounted on a display panel thereof.

The meritorious effects of the present invention are summarized as follows.

According to the present invention (in the aspects 1 to 15), connection between the respective heat dissipation patterns and the semiconductor device becomes secure, the surface area of the heat dissipation patterns is increased, and heat conduction paths are secured. Consequently, heat dissipation of a TCP product can be improved. With this arrangement, the increase in temperature of the semiconductor device due to heat generation associated with operation of the semiconductor device can be suppressed, and thermal resistance of the semiconductor device can be thereby reduced. Further, since a separate heat dissipation plate is not overlaid on the semiconductor device, the above-mentioned effect can be achieved without increasing the thickness of the tape carrier package. In addition, since bonding between the heat dissipating electrodes and the heat dissipation patterns can be performed in one step using the same bonding process as that for bonding between the input and output electrode patterns of the semiconductor device and the input and output lead patterns of the tape carrier, the above-mentioned effect can be achieved without additional a manufacturing step.

PREFERRED MODES OF THE INVENTION

First Example

A tape carrier package according to a first example of the present invention will be described using drawings.

Figure 1:
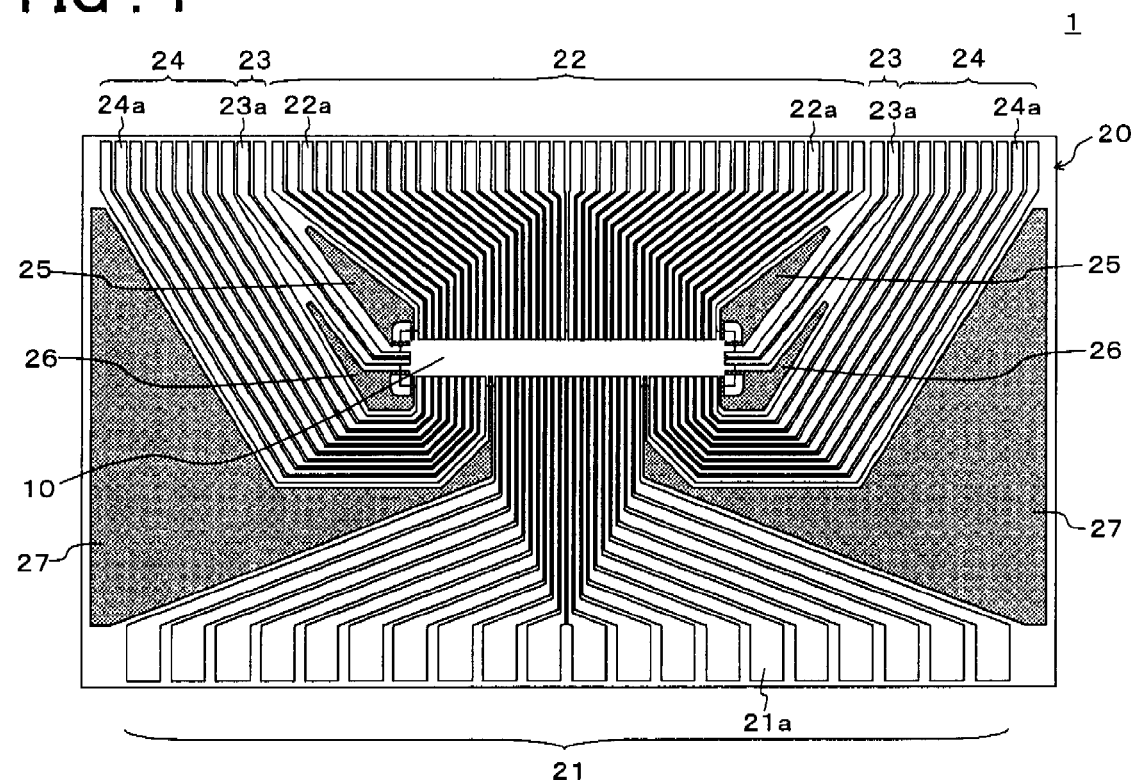
FIG. 1 is a plan view schematically showing a configuration of a tape carrier package according to a first example of the present invention.
Figure 2:
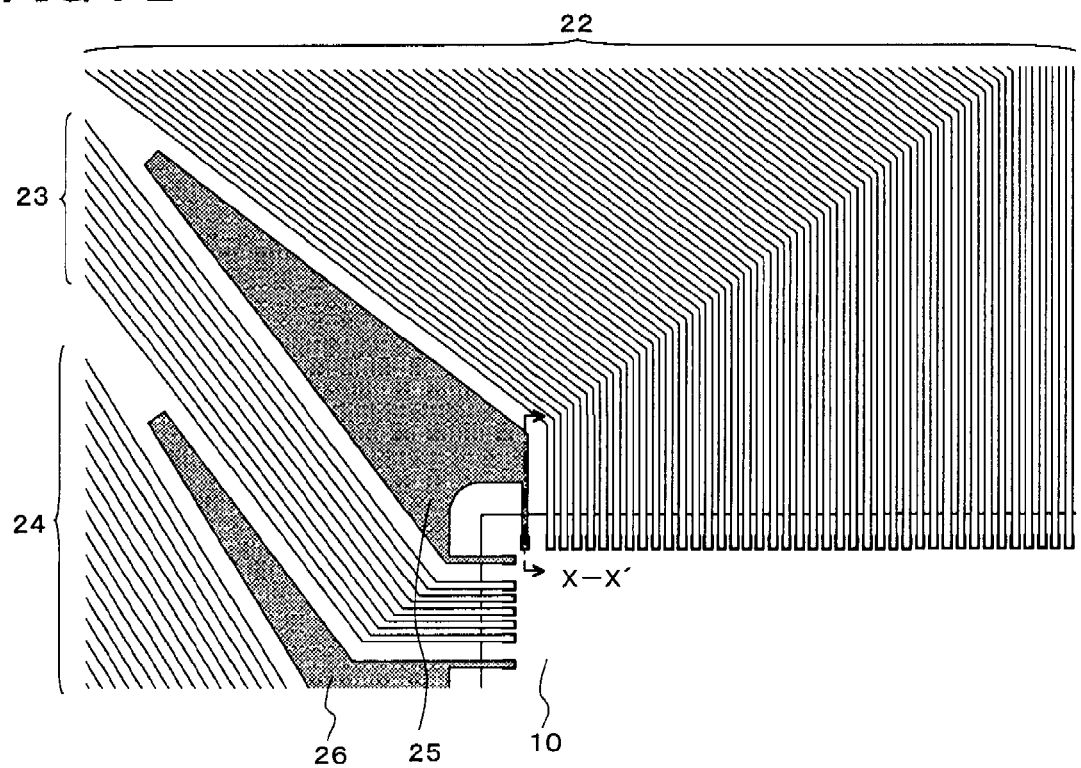
FIG. 2 is a partially enlarged view schematically showing the configuration of the tape carrier package according to the first example of the present invention.
Figure 3:
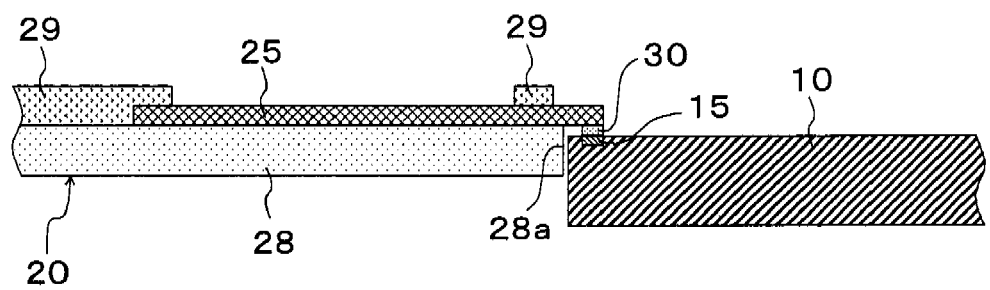
FIG. 3 is a partially enlarged sectional view taken along line X-X' of FIG. 2, schematically showing the configuration of the tape carrier package according to the first example of the present invention.
Figure 4:
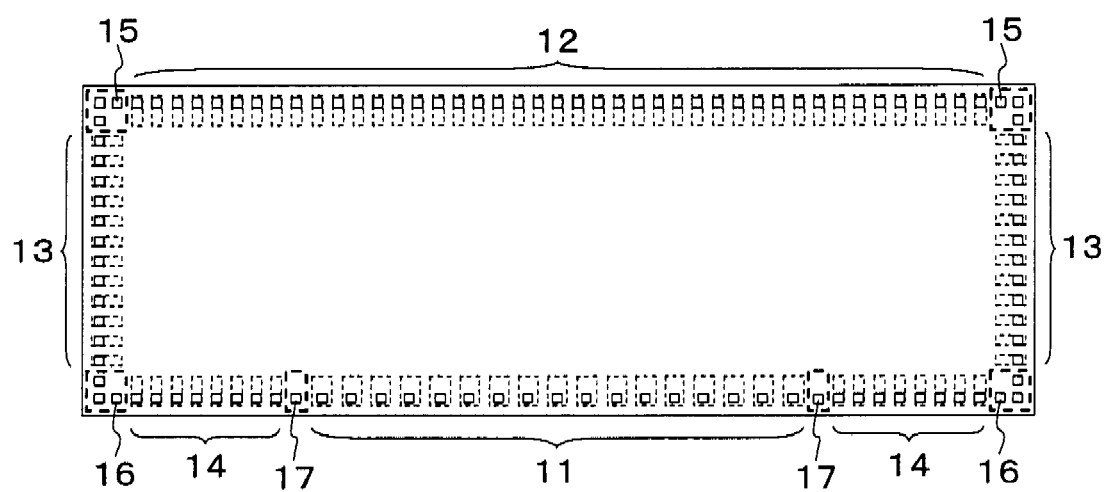
FIG. 4 is a plan view schematically showing electrode patterns of a semiconductor device of the tape carrier package according to the first example of the present invention.

FIG. 1 is a plan view schematically showing a configuration of the tape carrier package according to the first example of the present invention. FIG. 2 is a partially enlarged plan view schematically showing the configuration of the tape carrier package according to the first example of the present invention. FIG. 3 is a partially enlarged sectional view taken along line X-X' in FIG. 2 and schematically showing the configuration of the tape carrier package according to the first example of the present invention. FIG. 4 is a plan view schematically showing electrode patterns in the tape carrier package according to the first example of the present invention.

Referring to FIG. 1, a tape carrier package 1 is a tape carrier package which is mounted on a display panel (not shown) such as a liquid crystal display, a plasma display, or the like, and which includes a semiconductor device 10 on a tape carrier 20 thereof. The tape carrier package 1 is electrically connected to the display panel (not shown) at output side external electrodes 22a, 23a, and 24a via an anisotropic conductive adhesive (ACF; not shown), for example, and is electrically connected to a bus substrate (not shown) at input side external electrodes 21a via an anisotropic conductive adhesive (ACF; not shown), for example. The bus substrate (not shown) supplies power and a control signal to the semiconductor device 10.

The semiconductor device 10 is a device which includes a semiconductor integrated circuit that drives the display panel (not shown), and is a display driver IC (IC chip) used for the display panel (not shown) (refer to FIGS. 1 to 4). The semiconductor device 10 is mounted in a predetermined position on the tape carrier 20. The semiconductor device 10 includes electrode patterns 11, 12, 13, and 14 and heat dissipating electrode patterns 15, 16, and 17 at peripheral portions of one surface thereof (refer to FIG. 4).

The electrode patterns 11 are constituted from input electrodes (of 40 to 50 electrodes, for example), and are disposed between the two groups of electrode patterns 14 in the vicinity of one side (or corner end) in a longitudinal direction of a rectangular shape of the device. The electrode patterns 11 are each electrically connected to a corresponding one of input lead patterns 21 through bumps (such as gold bumps, not shown) using pressure bonding (that includes pressure welding, adhesion, and alloy junction, which is the same in the following). A group of electrode patterns 12 is constituted from output electrodes and is disposed in the vicinity of the other side (opposite to the one side) in the longitudinal direction of the rectangular shape. The electrode patterns 12 are each electrically connected to a corresponding one of output lead patterns 22 through bumps (such as the gold bumps, not shown) using the pressure bonding. The electrode patterns 13 are each constituted from output electrodes, and are disposed in the vicinity of two sides in a transverse direction of the rectangular shape. Each of the electrode patterns 13 is electrically connected to corresponding one of output lead patterns 23 through a bump (such as the gold bump, not shown) using the pressure bonding. The electrode patterns (two groups) 14 are each constituted from output electrodes and are disposed in the vicinity of the one side in the longitudinal direction of the rectangular shape and externally on both sides of the electrode patterns 11. Each of the electrode patterns 14 is electrically connected to a corresponding one of lead patterns 24 through a bump (such as the gold bump, not shown) using the pressure bonding. Incidentally, the total number of the electrode patterns 12, 13, and 14 constituted from the output side electrodes is 800 to 1000, for example.

Disposition of the output electrode patterns 13 in the vicinity of the two sides in the transverse direction of the rectangular shape is associated with an increase in the number of outputs for implementing a multi-channel configuration. Disposition of the output electrode patterns 14 on both sides externally of the input side electrode patterns 11 in the vicinity of the one side (corner end) in the longitudinal direction of the rectangular shape is also associated with the increase in the number of outputs for implementing the multi-channel configuration.

The heat dissipating electrode patterns 15 are disposed at positions where the heat dissipating electrode patterns 15 do not conflict with the electrode patterns 11, 12, 13, and 14, i.e., in the vicinity of corner portions of the rectangular shape where the other side in the longitudinal direction of the rectangular shape and the two sides in the transverse direction of the rectangular shape cross (or disposed in spaces each enclosed by a bold dot line, each space being disposed such that a column of the electrode patterns 13 does not cross a row of the electrode patterns 12). Each of the heat dissipating electrode patterns 15 is electrically and thermally connected to corresponding one of heat dissipation patterns 25 through a bump 30 (such as a gold bump) using the pressure bonding (refer to FIG. 3). The heat dissipating electrode patterns 16 are disposed in the vicinity of corner portions of the rectangular shape where the one side in the longitudinal direction of the rectangular shape and the two sides in the transverse direction of the rectangular shape cross (or disposed in spaces each enclosed by a bold dot line, i.e., each disposed such that the column of the electrode pattern 13 does not cross a row of the electrode patterns 14). Each of the heat dissipating electrode patterns 16 is electrically and thermally connected to corresponding one of heat dissipation patterns 26 through a bump (such as a gold bump, not shown) using the pressure bonding (refer to FIG. 3). The heat dissipating electrode patterns 17 are disposed in the vicinity of the one side in the longitudinal direction of the rectangular shape and are each disposed between (a group of) the input electrode patterns 11 and (a group of) output electrode patterns 14. Each of the heat dissipating electrode patterns 17 is electrically and thermally connected to corresponding one of heat dissipation patterns 27 using the pressure bonding.

Disposition of the heat dissipating electrode patterns 15 and 16 in the vicinity of the corner portions of the rectangular shape is to utilize dead spaces where the electrode patterns 12, 13, and 14 cannot be disposed. The heat dissipating electrode patterns 17 are disposed between the group of the input electrode patterns 11 and the group of the output electrode patterns 14 because it is necessary to provide a predetermined interval in order to avoid interference between the input electrode patterns 11 and the output electrode pattern 14, and for a purpose of utilizing the interval that will become a dead space.

The tape carrier 20 is a flexible wiring board and is on a backsurface of a tape base 28 (film layer) (which is the same in the following description and shown as an upper side of FIG. 3). Between the tape base 28 and an insulating layer 29, the lead patterns 21, 22, 23, and 24 (including the input side external electrodes 21a, and the output side external electrodes 22a, 23a, and 24a) and the heat dissipation patterns 25, 26, and 27 are formed. In a central portion of the tape base 28, a vacant space 28a for accommodating a part (or the entire) of the semiconductor device 10 is formed (refer to FIGS. 1 to 3).

The tape base 28 is a flexible member in the form of a tape, made of an insulating material such as polyimide, or PET (polyethylene terephthalate). The tape base 28 includes portions corresponding to the lead patterns 21, 22, 23, and 24 and the heat dissipation patterns 25, 26, and 27, respectively, and the vacant space 28a immediately beneath the semiconductor device 10. In predetermined positions of the backsurface of the tape base 28, the lead patterns 21, 22, 23, and 24 (including the input external electrodes 21a and the output external electrodes 22a, 23a, and 24a), the heat dissipation patterns 25, 26, and 27, and the insulating layer 29 are disposed.

The lead patterns 21 are constituted from input leads (such as 40 to 50 leads) made of a conductive material such as a copper foil (e.g. a tin-plated copper base material, or a gold-plated copper base material) formed on the backsurface (or may be a surface) of the tape base 28. The (row of) lead patterns 21 are disposed from the vicinity of one side in a longitudinal direction of the vacant space 28a to the vicinity of one side in a longitudinal direction of the tape base 28. Ends of the lead pattern 21 on a side of the vacant space 28a extend to the vacant space 28a, and the lead patterns 21 are electrically connected to the corresponding electrode patterns 11 (refer to FIG. 4) of the semiconductor device 10 through bumps (such as the gold bumps, not shown) at the extending ends, using the pressure bonding. The lead pattern 21 includes the input side external electrodes 21a in the vicinity of the one side in the longitudinal direction of the tape base 28. The input side external electrodes 21a are electrically connected to the bus substrate (not shown) via the anisotropic conductive adhesive (ACF not shown), for example.

The lead patterns 22 are constituted from output side leads made of a conductive material such as the copper foil (e.g. the tin-plated copper base material, or the gold-plated copper base material) formed on the backsurface (or may be the surface) of the tape base 28. The lead patterns 22 are led out from the vicinity of the other side in the longitudinal direction of the vacant space 28a and are disposed in the vicinity of the other side in the longitudinal direction of the tape base 28. Ends of the lead patterns 22 on a side of the vacant space 28a extend to the vacant space 28a, and the lead patterns 21 are electrically connected to the corresponding electrode patterns 12 (refer to FIG. 4) of the semiconductor device 10 through bumps (such as the gold bumps, not shown) at the extending ends, using the pressure bonding. The lead patterns 22 each includes the output side external electrodes 22a in the vicinity of the other side in the longitudinal direction of the tape base 28. The output side external electrodes 22a are electrically connected to the display panel (not shown) via the anisotropic conductive adhesive (ACF not shown), for example.

The lead patterns 23 are each constituted from output side leads made of a conductive material such as the copper foil (e.g. the tin-plated copper base material, or the gold-plated copper base material) formed on the backsurface (or may be the surface) of the tape base 28. The lead patterns 23 are led out from the vicinity of sides in a transverse direction of the vacant space 28a and are disposed in the vicinity of the other side in the longitudinal direction of the tape base 28 so that the lead patterns 23 circumvent the heat dissipation patterns 25 and the lead pattern 22. An end of each lead pattern 23 on the side of the vacant space 28a extends to the vacant space 28a, and the lead pattern 23 is electrically connected to the corresponding one of the electrode patterns 13 (refer to FIG. 4) of the semiconductor device 10 through a bump (such as the gold bump, not shown) at the extending end using the pressure bonding. Each lead pattern 23 includes output side external electrodes 23a in the vicinity of the other side of the longitudinal direction of the tape base 28. The output side external electrodes 23a are electrically connected to the display panel (not shown) via the anisotropic conductive adhesive (ACF not shown), for example.

The lead patterns 24 are each constituted from output side leads made of a conductive material such as the copper foil (e.g. the tin-plated copper base material, or the gold-plated copper base material) formed on the backsurface (or may be the surface) of the tape base 28. The lead patterns 24 are led out from the vicinity of both sides (side ends) of the row of the lead patterns 21 on one longitudinal side of the vacant space 28a extending to (the vicinity of) the other longitudinal side of the tape base 28, so that the lead patterns 24 circumvent the heat dissipation patterns 26, the lead patterns 23, the heat dissipation patterns 25, and the lead patterns 22. An end of each lead pattern 24 on the side of the vacant space 28a extends to the vacant space 10, and the lead patterns 23 are electrically connected to the corresponding electrode patterns 14 (refer to FIG. 4) of the semiconductor device 10 through bumps (such as the gold bump, not shown) at the extending ends, using the pressure bonding. Each lead pattern 24 includes output side external electrodes 24a in the vicinity of the other longitudinal side of the tape base 28. The output side external electrodes 24a are electrically connected to the display panel (not shown) via the anisotropic conductive adhesive (ACF not shown), for example.

The heat dissipation patterns 25 are heat dissipation patterns which are formed on the backsurface (or may be the surface) of the tape base 28 at positions where the heat dissipation patterns 25 do not interfere with the lead patterns 21, 22, 23, nor 24, and are each made of a conductive material such as the copper foil (e.g. the tin-plated copper base material, or the gold-plated copper base material). Each heat dissipation pattern 25 is disposed in a region between (outermost one of) the groups of the lead patterns 22 and (innermost one of) the group of lead patterns 23. An end of each heat dissipation pattern 25 on the side of the vacant space 28a extends to the vacant space 28a. The heat dissipation pattern 25 is electrically and thermally connected to the corresponding one of the heat dissipating electrode patterns 15 (refer to FIGS. 3 and 4) of the semiconductor device 10 at the extending end through the bump 30 (such as the gold bump) using the pressure bonding.

The heat dissipation patterns 26 are heat dissipation patterns which are formed on the backsurface (or may be upper surface) of the tape base 28 at positions where the heat dissipation patterns 26 do not interfere with the lead patterns 21, 22, 23, nor 24, and are each made of an electro-conductive material such as the copper foil (e.g. the tin-plated copper base material, or the gold-plated copper base material). Each heat dissipation pattern 26 is disposed in a region between (innermost one of) the group of lead patterns 24 and (outermost one of) the group of lead patterns 23. A pair of bifurcated ends of each of the heat dissipation patterns 26 on the side of the vacant space 28a extends to the vacant space 28a. Each of the heat dissipation patterns 26 is electrically and thermally connected to the corresponding heat dissipating electrode pattern 16 (refer to FIGS. 3 and 4) of the semiconductor device 10 at the extending end through a bump (such as the gold bump, not shown) using the pressure bonding.

The heat dissipation patterns 27 are heat dissipation patterns which are formed on the backsurface (or may be upper surface) of the tape base 28 at positions where the heat dissipation patterns 27 do not interfere with the lead patterns 21, 22, 23, nor 24, and are each made of an electro-conductive material such as the copper foil (e.g. the tin-plated copper base material, or the gold-plated copper base material). Each of the heat dissipation patterns 27 is disposed in a region between an outermost one of (a group of) the lead patterns 24 and an outermost one of (a group of) the lead patterns 21. An end of each heat dissipation patterns 27 on the side of the vacant space 28a extends to the longitudinal side (lower side in FIG. 1) of the vacant space 28a. Each of the heat dissipation patterns 27 is electrically and thermally connected to corresponding one of the heat dissipating electrode patterns 17 (refer to FIG. 4) of the semiconductor device 10 at the extended end through a bump (such as the gold bump, not shown), using the pressure bonding.

Preferably, the heat dissipation patterns 25 to 27 are formed in the form of island having a wider planar area than each lead of the lead patterns 21 to 24. It is further preferred that the (first) heat dissipation patterns 25, the (second) heat dissipation patterns 26, and the (third) heat dissipation patterns 27 are provided as a symmetrical shape, respectively. However, the shapes of the heat dissipation patterns 25 to 27 are not limited to these configurations. When the gold-plated copper base material is employed for the lead patterns 21 to 24 and the heat dissipation patterns 25 to 27, there is an advantage that the lead patterns and the heat dissipation patterns are more advantageous in terms of deterioration of the electrodes of the semiconductor device 10, and that no whisker is generated. When the tin-plated copper base material is employed for the lead patterns 21 to 24 and the heat dissipation patterns 25 to 27, an eutectic alloy is formed between the tin-plated copper base material and the bumps (gold bumps) formed on the electrodes of the semiconductor device 10 due to heat-pressure bonding. Accordingly, there is an advantage that adhesion strength of the lead patterns 21 to 24 and the heat dissipation patterns 25 to 27 are stronger than those for which the gold-plated copper base material is employed, and therefore the heat-pressure bonding is facilitated.

The insulating layer 29 is an insulating layer made of an insulating material such as solder resist. The insulating layer 29 covers the backsurface of the tape base 28 excluding at least electrical connecting portions with the lead patterns 21, 22, 23, and 24. Since the insulating layer 29 has a thin film thickness, heat dissipation will not be hindered even if part or the entire of heat dissipation surfaces of the heat dissipation patterns 25, 26, and 27 are covered with the insulating layer 29. However, for enhancing the heat dissipation, it is preferred that the heat dissipation surfaces are not covered with the insulating layer 29. When the tape base 28 is seen from the backside thereof, at least the input side external electrodes 21a, output side external electrodes 22a, 23a, and 24a, and the heat dissipation surfaces of the heat dissipation patterns 25, 26, and 27 are exposed.

Operation of the tape carrier package according to the first example will be described.

Operation of driving the display panel (not shown) will be described. A control signal and power for the semiconductor device 10 are input to the semiconductor device 10 from a controller (not shown) through a bus substrate (not shown) and the input lead patterns 21. Then, the semiconductor device 10 generates a driving signal for operating the display panel (not shown) based on the input control signal, and outputs a driving signal to the display panel (not shown) through the lead patterns 22, 23, and 24. Then, on the display panel (not shown), display of an image is performed based on the input driving signal. On a liquid display panel, for example, transmissivity in a liquid crystal layer is changed based on the input driving signal, pixels are switched ON/OFF, and image display is performed.

Heat dissipation of the tape carrier package 1 will be described. Heat generated in the semiconductor device 10 when the display panel (not shown) is operated is conducted to external components (which are the bus substrate and the display panel) through the lead patterns 21 to 24, and is also conducted to the heat dissipation patterns 25 to 27, and discharged to outside (atmosphere).

According to the first example, connection between the semiconductor device 10 and each of the heat dissipation patterns 25 to 27 is ensured, surface areas of the heat dissipation patterns 25 to 27 are increased, and heat conduction paths are secured. Accordingly, heat dissipation of a TCP product can be improved. With this arrangement, an increase in temperature of the semiconductor device due to heat generation associated with an operation of the semiconductor device is suppressed. Thermal resistance of the semiconductor device can be thereby reduced. When the same IC chip is mounted, the thermal resistance in the first example is reduced by approximately 20% than a conventional TCP.

Second Example

A tape carrier package according to a second example of the present invention will be described, using a drawing. FIG.

5 is a plan view schematically showing a configuration of the tape carrier package according to the second example of the present invention.

In the tape carrier package 1 according to the second example a grounding or signal external electrode 27a is provided at each heat dissipation pattern 27. Other configurations are the same as those in FIG. 1.

The heat dissipation patterns 27 are heat dissipation patterns which are formed on the backsurface of the tape base 28 and are each made of an electro-conductive material such as the copper foil (e.g. the tin-plated copper base material, or the gold-plated copper base material). Each of the heat dissipation patterns 27 is disposed in the region between an outermost one of (a group of) the lead patterns 24 and an outermost one of (a group of) the lead patterns 21. An end of the heat dissipation pattern 27 on the side of the vacant space 28a extends to (the longitudinal side of) the vacant space 28a. Each of the heat dissipation patterns 27 is electrically and thermally connected to the corresponding one of the heat dissipating electrode patterns 17 (refer to FIG. 4) of the semiconductor device 10 at the extending end through a bump (such as the gold bump, not shown) using the pressure bonding. The heat dissipating electrode patterns 17 are also a grounding or signal electrode of the semiconductor device 10. Each of the heat dissipation patterns 27 includes the external electrode 27a at each side of the input side external electrodes 21a in the vicinity of the one longitudinal side (or the other side) of the tape base 28 at the corner thereof. The external electrode 27a is electrically and thermally connected to a grounding or signal electrode (not shown) of the bus substrate (not shown) via the anisotropic conductive adhesive (ACF; not shown), for example.

Heat dissipation of the tape carrier package 1 will be described. Heat generated in the semiconductor device 10 when the display panel (not shown) is operated is conducted to the external components (, e.g., which are the bus substrate and display panel) through the lead patterns 21 to 24, and is also conducted to the heat dissipation patterns 25 and 26 and discharged to outside. The heat is conducted to the heat dissipation patterns 27, discharged to outside, and also conducted to the bus substrate (not shown).

According to the second example, the same effect as that in the first example is achieved, and the heat dissipation patterns 27 function as grounding or signal wiring as well. Accordingly, additional heat conduction paths are secured. Heat dissipation of the TCP product can be further improved.

Incidentally, in the first and second examples, grounding or signal external electrodes are not provided at the heat dissipation patterns 25 and 26. However, the grounding or signal external electrode may be provided at each of the heat dissipation patterns 25 and 26, and the heat dissipation patterns 25 and 26 may be electrically and thermally connected to the display panel.

Third Example

Figure 6:
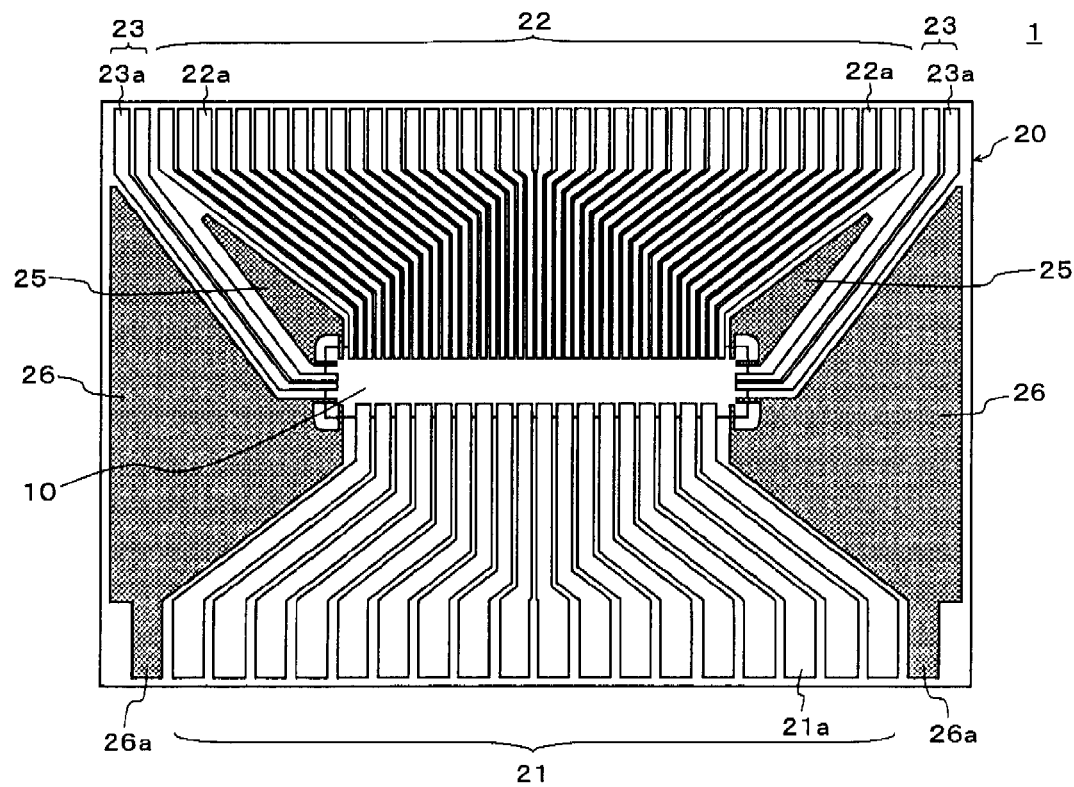
FIG. 6 is a plan view schematically showing a configuration of a tape carrier package according to a third example of the present invention.
Figure 7:
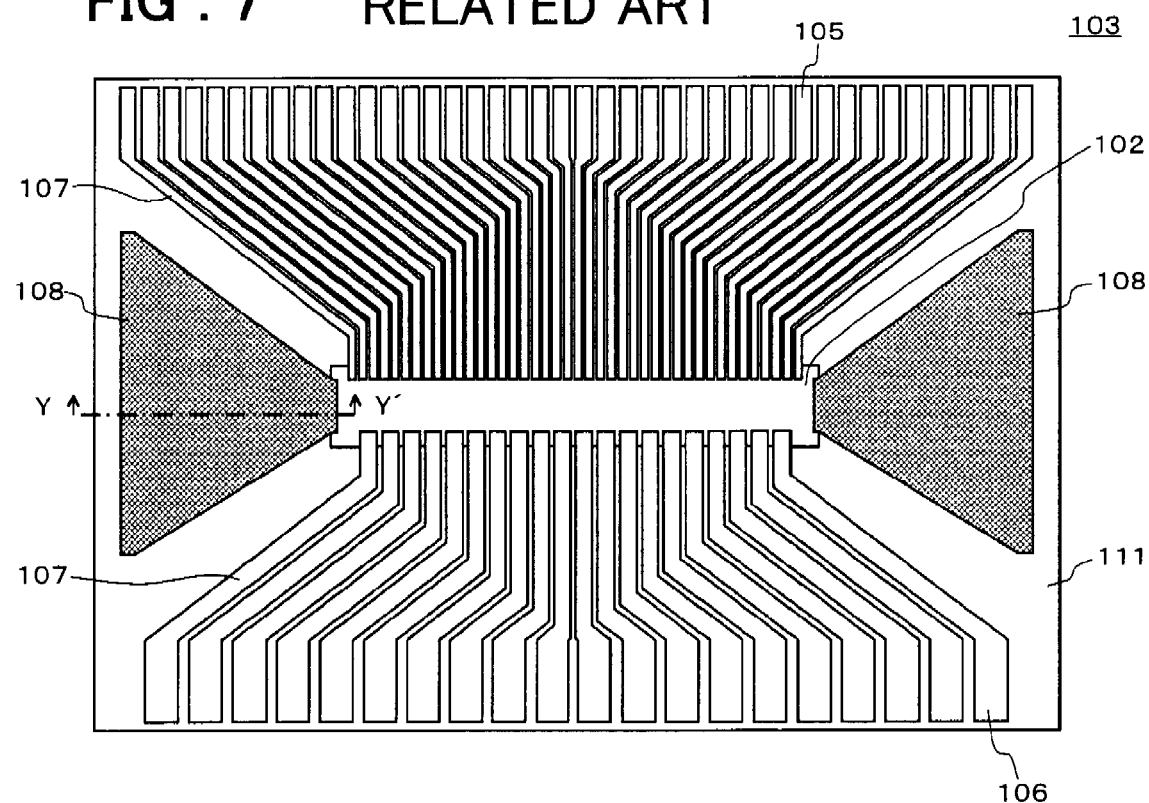
FIG. 7 is a plan view schematically showing a configuration of a tape carrier package according to a related art.
Figure 8:
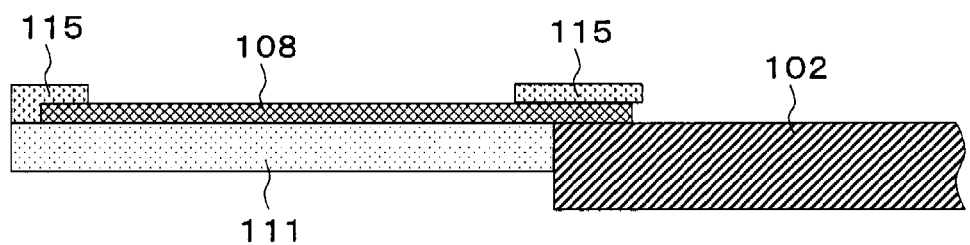
FIG. 8 is a partially enlarged sectional view taken along line Y-Y' of FIG. 7, schematically showing the configuration of the tape carrier according to a related art.

A tape carrier package according to a third example of the present invention will be described, using a drawing. FIG. 6 is a plan view schematically showing a configuration of the tape carrier package according to the third example of the present invention.

Figure 5:
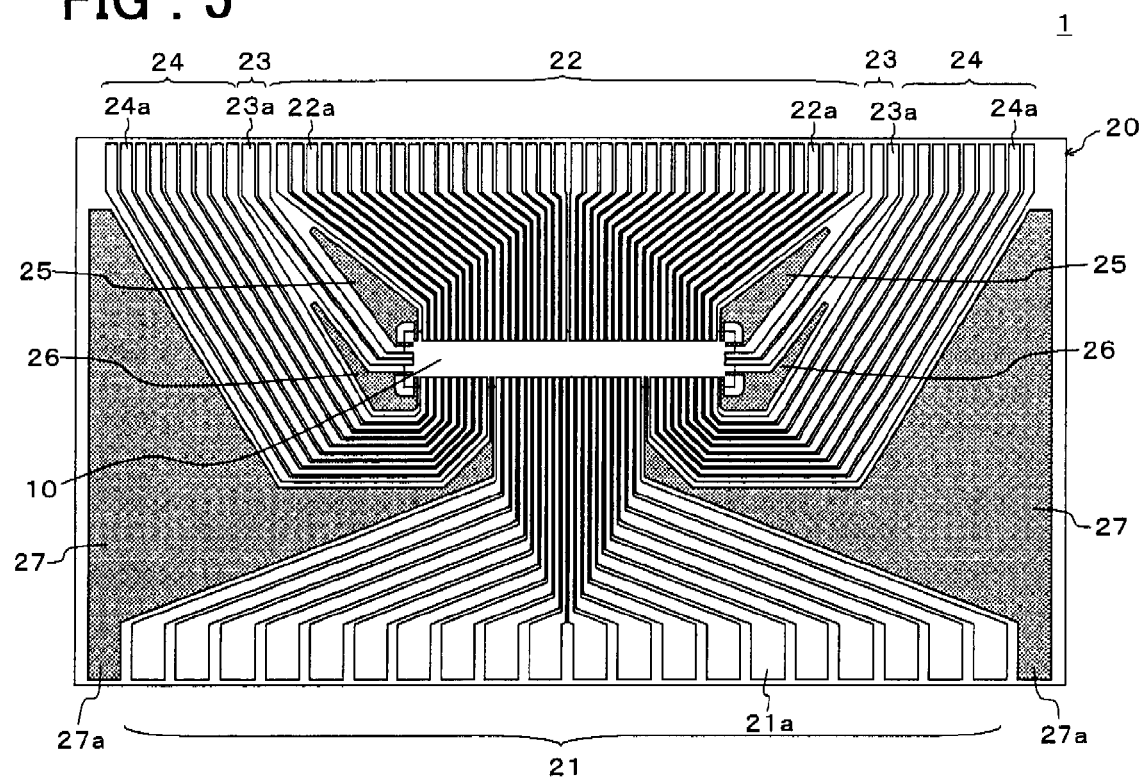
FIG. 5 is a plan view schematically showing a configuration of a tape carrier package according to a second example of the present invention.

In the tape carrier 20 of the tape carrier package I according to the third example, the heat dissipation patterns (indicated by reference numeral 27 in FIGS. 1 and 5) and the lead patterns (indicated by reference numeral 24 in FIGS. 1 and 5) like those in the first and second examples are omitted. Areas of the heat dissipation patterns 26 are increased, and the (second) heat dissipation patterns 26 are provided in spaces which have become unoccupied by the omission. A grounding or signal external electrode 26a is provided at each of the heat dissipation patterns 26. The semiconductor device 10 does not have the electrode pattern (indicated by reference numeral 14 in FIG. 4) and the heat dissipating electrode pattern (indicated by reference numeral 17 in FIG. 4) like those in the first and second examples. Electrode patterns (not shown) are disposed at positions corresponding to the lead patterns 21 to 23 of the tape carrier 20 in FIG. 6 and heat dissipating electrode patterns (not shown) are disposed at positions corresponding to the heat dissipation patterns 25 and 26 of the tape carrier 20 in FIG. 6. Other configurations are the same as those in the first and second examples.

The heat dissipation patterns 26 are heat dissipation patterns which are formed on the backsurface (or may be upper surface) of the tape base 28 at positions where the heat dissipation patterns 26 do not interfere with the lead patterns 21, 22, nor 23, and are each made of a conductive material such as the copper foil (e.g. the tin-plated copper base material, or the gold-plated copper base material). Each of the heat dissipation patterns 26 is disposed in the region (vacant space) between an outermost one of (a group of) the lead patterns 24 and an outermost one of the lead patterns 23. An end of the heat dissipation pattern 26 on the side of the vacant space 28a extends to the vacant space 28a. Each of the heat dissipation patterns 26 is electrically and thermally connected to corresponding one of the heat dissipating electrode patterns 16 (refer to FIG. 4) of the semiconductor device 10 at the extending end through a bump (such as the gold bump, not shown), using the pressure bonding. The heat dissipating electrode pattern 16 is also a grounding or signal electrode of the semiconductor device 10. Each of the heat dissipation patterns 26 includes the external side electrode 26a at each side of (outermost one of) the input side external electrodes 21a in the vicinity of the one longitudinal side (or the other side) of the tape base 28. The external electrodes 26a are electrically and thermally connected to the grounding or signal electrode (not shown) of the bus substrate (not shown) via the anisotropic conductive adhesive (ACF; not shown), for example.

Heat dissipation of the tape carrier package 1 will be described. Heat generated in the semiconductor device 10 when the display panel (not shown) is operated is conducted to the external components (which typically comprise the bus substrate and the display panel) through the lead patterns 21 to 23, and is also conducted to the heat dissipation patterns 25. The heat is discharged to the outside (exterior), conducted to the heat dissipation patterns 26, discharged to the outside, and also conducted to the bus substrate (not shown).

According to the third example, the same effect as that in the first example is achieved, and the heat dissipation pattern 26 also functions as grounding or signal wiring as well. Accordingly, additional heat conduction paths are further secured. Heat dissipation of the TCP product can be further improved.

Incidentally, in the third example, no grounding or signal external electrode is provided at the heat dissipation patterns 25. However, the grounding or signal external electrode may be provided at the heat dissipation patterns 25, and the heat dissipation patterns 25 may be electrically and thermally connected to the display panel.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A tape carrier package comprising:
   a tape carrier having lead patterns fowled on a tape base thereof, said lead patterns being made of an electro-conducting material, said tape base being made of an insulating material; and
   a semiconductor device mounted on said tape carrier and having signal input and output electrode patterns disposed on peripheral portions of a surface of the semiconductor device on the same side as a first surface of said tape base; wherein
   said semiconductor device includes heat dissipating electrode patterns, each of which is located on a peripheral portion, of said surface of the semiconductor device at a position where said each of said heat dissipating electrode patterns does not interfere with said electrode patterns;
   each of said lead patterns is electrically connected to a corresponding one of said electrode patterns;
   heat dissipation patterns are formed on said tape carrier, each of which is disposed at a position on the first surface of said tape base where said each of said heat dissipation patterns does not interfere with said lead patterns, said each of said heat dissipation patterns being electrically and thermally connected to a corresponding one of said heat dissipating electrode patterns of said semiconductor device, said each of said heat dissipation patterns being made of an electro-conductive material; and
   wherein said heat dissipation patterns have a surface area broader than that of said lead patterns.

2. The tape carrier package according to claim 1, wherein a vacant space for accommodating a part or entire of said semiconductor device is formed on said tape base;
   one ends of said lead patterns extend to said vacant space, and each of said lead patterns is electrically and thermally connected to corresponding one of said electrode patterns of said semiconductor device at extending one end; and
   one ends of said heat dissipation patterns extend to said vacant space, and each of said heat dissipation patterns is electrically and thermally connected to corresponding one of said heat dissipating electrode patterns of said semiconductor device at the extending one end.

3. The tape carrier package according to claim 1, wherein said lead patterns comprise an input lead pattern including input external terminals in the vicinity of a first side of said tape base, and output lead patterns including output external terminals in the vicinity of a second side opposite to said first side of said tape base.

4. The tape carrier package according to claim 1, wherein said each of said heat dissipation patterns and the corresponding one of said heat dissipating electrode patterns of said semiconductor, device are electrically and thermally connected using pressure bonding between a bump formed on the corresponding one of said heat dissipating electrode pattern and said each of said heat dissipation patterns.

5. The tape carrier package according to claim 4, wherein the bump comprises a gold bump; and
   said each of said heat dissipation patterns is made of a tin-plated copper base material or a gold-plated copper base material.

6. The tape carrier package according to claim 1, wherein said semiconductor device has a surface, which said electrode, patterns are disposed on and has a rectangular shape; and
   said heat dissipating electrode patterns are disposed at least in the vicinity of a corner portion or portions of said rectangular shape.

7. The tape carrier package according to claim 6, wherein said electrode patterns comprise:
   input electrode patterns disposed in the vicinity of a first side of said semiconductor device;
   first output electrode patterns disposed in the vicinity of a second side opposite to said first side of said semiconductor device; and
   second output electrode patterns disposed in the vicinity of a third side or sides located in a direction at a right angle to said first side of said semiconductor device;
   said output lead patterns comprise:
   first output lead patterns electrically connected to corresponding ones of said first output electrode patterns, respectively; and
   second output lead patterns electrically connected to corresponding ones of said second output electrode patterns, respectively; and
   said input lead patterns are electrically connected to corresponding ones of said input electrode patterns, respectively.

8. The tape carrier package according to claim 7, wherein each of said second heat dissipation patterns includes a grounding external terminal or a signal external terminal in the vicinity of said first side or said second side of said tape base.

9. The tape carrier package according to claim 7, wherein said electrode patterns include third output electrode pattern disposed on at least one side of said input electrode pattern, in the vicinity of said first side of said semiconductor device; and
   said output lead patterns include a third output lead patterns electrically connected to corresponding ones of the third output electrode patterns, respectively.

10. A display device having said tape carrier package as set forth in claim 1 mounted on a display panel thereof.

11. A tape carrier package comprising:
    a tape carrier having lead patterns formed on a tape base thereof, said lead patterns being made of an electro-conducting material, said tape base being made of an insulating material; and
    a semiconductor device mounted on said tape carrier and having signal input and output electrode patterns disposed on peripheral portions of a surface of the semiconductor device on the same side as a first surface of said tape base; wherein
    said semiconductor device includes heat dissipating electrode patterns, each of which is located on a peripheral portion of said surface of the semiconductor device at a position where said each of said heat dissipating electrode patterns does not interfere with said electrode patterns;
    each of said lead patterns is electrically connected to a corresponding one of said electrode patterns;
    heat dissipation patterns are formed on said tape carrier, each of which is disposed at a position on the first surface of said tape base where said each of said heat dissipation patterns does not interfere with said lead patterns, said each of said heat dissipation patterns being electrically and thermally connected to a corresponding one of said heat dissipating electrode patterns of said semiconductor device, said each of said heat dissipation patterns being made of an electro-conductive material;
wherein said semiconductor device has a surface, which said electrode patterns are disposed on and has a rectangular shape;
said heat dissipating electrode patterns are disposed at least in the vicinity of a corner portion or portions of said rectangular shape;
wherein said electrode patterns comprise:
input electrode patterns disposed in the vicinity of a first side of said semiconductor device;
first output electrode patterns disposed in the vicinity of a second side opposite to said first side of said semiconductor device;
second output electrode patterns disposed in the vicinity of a third side or sides located in a direction at a right angle to said first side of said semiconductor device;
said output lead patterns comprise:
first output lead patterns electrically connected to corresponding ones of said first output electrode patterns, respectively; and
second output lead patterns electrically connected to corresponding ones of said second output electrode patterns, respectively;
said input lead patterns are electrically connected to corresponding ones of said input electrode patterns, respectively;
wherein said heat dissipation patterns comprise:
first heat dissipation patterns disposed between a group of said first output lead patterns and a group of said second output lead patterns; and
second heat dissipation patterns disposed between the group of said input lead pattern and the group of said second output lead patterns; wherein
each of said first heat dissipation patterns and said second heat dissipation patterns is electrically and thermally connected to corresponding one of said heat dissipating electrode patterns disposed in the vicinity of a corner portion or portions of said rectangular shape.

12. The tape carrier package according to claim 7, wherein each of said first heat dissipation patterns includes a grounding external terminal or a signal external terminal in the vicinity of said second side of said tape base.

13. A tape carrier package comprising:
a tape carrier having lead patterns formed on a tape base thereof, said lead patterns being made of an electro-conducting material, said tape base being made of an insulating material; and
a semiconductor device mounted on said tape carrier and having signal input and output electrode patterns disposed on peripheral portions of a surface of the semiconductor device on the same side as a first surface of said tape base; wherein
said semiconductor device includes heat dissipating electrode patterns, each of which is located on a peripheral portion of said surface of the semiconductor device at a position where said each of said heat dissipating electrode patterns does not interfere with said electrode patterns;
each of said lead patterns is electrically connected to a corresponding one of said electrode patterns;
heat dissipation patterns are formed on said tape carrier, each of which is disposed at a position on the first surface of said tape base where said each of said heat dissipation patterns does not interfere with said lead patterns, said each of said heat dissipation patterns being electrically and thermally connected to a corresponding one of said heat dissipating electrode patterns of said semiconductor device, said each of said heat dissipation patterns being made of an electro-conductive material;
wherein said semiconductor device has a surface, which said electrode patterns are disposed on and has a rectangular shape;
said heat dissipating electrode patterns are disposed at least in the vicinity of a corner portion or portions of said rectangular shape;
wherein said electrode patterns comprise:
input electrode patterns disposed in the vicinity of a first side of said semiconductor device;
first output electrode patterns disposed in the vicinity of a second side opposite to said first side of said semiconductor device;
second output electrode patterns disposed in the vicinity of a third side or sides located in a direction at a right angle to said first side of said semiconductor device;
said output lead patterns comprise:
first output lead patterns electrically connected to corresponding ones of said first output electrode patterns, respectively;
second output lead patterns electrically connected to corresponding ones of said second output electrode patterns, respectively;
said input lead patterns are electrically connected to corresponding ones of said input electrode patterns, respectively;
wherein the heat dissipating electrode patterns are each disposed between a group of said input electrode patterns and a group of said third output electrode patterns as well;
said heat dissipation patterns comprise:
first heat dissipation patterns disposed between a group of said first output lead patterns and a group of said second output lead patterns;
second heat dissipation patterns disposed between a group of said third output lead patterns and a group of said second output lead patterns;
third heat dissipation patterns disposed between a group of said third output lead patterns and a group of said input lead patterns;
each of said first heat dissipation patterns and said second heat dissipation patterns being electrically and thermally connected to a corresponding one of said heat dissipating electrode patterns disposed in the vicinity of the corner portion or portions of said rectangular shape; and
each of said third heat dissipation patterns being electrically and thermally connected to one of the heat dissipating electrode patterns disposed between the group of said input electrode patterns and the group of said third output electrode patterns.

14. The tape carrier package according to claim 13, wherein said third heat dissipation patterns include a grounding external terminal or a signal external terminal in the vicinity of said first side or said second side of said tape base.

15. The tape carrier package according to claim 13, wherein at least one of said first heat dissipation patterns and said second heat dissipation patterns includes a grounding external terminal or a signal external terminal in the vicinity of said second side of said tape base.

16. A tape carrier package comprising:
a tape carrier having lead patterns formed on a tape base thereof, said lead patterns being made of an electro-conducting material, said tape base being made of an insulating material; and a semiconductor device mounted on said tape carrier and having signal input and output electrode patterns disposed on peripheral portions of a surface of the semiconductor device on the same side as a first surface of said tape base; wherein said semiconductor device includes heat dissipating electrode patterns, each of which is located on a peripheral portion of said surface of the semiconductor device at a position where said each of said heat dissipating electrode patterns does not interfere with said electrode patterns;

each of said lead patterns is electrically connected to a corresponding one of said electrode patterns;

heat dissipation patterns are formed on said tape carrier, each of which is disposed at a position on the first surface of said tape base where said each of said heat dissipation patterns does not interfere with said lead patterns, said each of said heat dissipation patterns being electrically and thermally connected to a corresponding one of said heat dissipating electrode patterns of said semiconductor device, said each of said heat dissipation patterns being made of an electro-conductive material; and wherein said heat dissipation patterns have a lead pattern width broader than that of said lead patterns.

* * * * *